(12) United States Patent
Temba

(10) Patent No.: US 7,516,542 B2
(45) Date of Patent: Apr. 14, 2009

(54) WIRING BOARD AND MANUFACTURING METHOD THEREFOR

(75) Inventor: Koji Temba, Soraku-gun (JP)

(73) Assignee: JTEKT Corporation, Osaka (JP)

( * ) Notice: Subject to any disclaimer, the term of this patent is extended or adjusted under 35 U.S.C. 154(b) by 556 days.

(21) Appl. No.: 11/254,312

(22) Filed: Oct. 19, 2005

(65) Prior Publication Data

US 2006/0091544 A1 May 4, 2006

(30) Foreign Application Priority Data

Nov. 2, 2004 (JP) ............................. 2004-319041

(51) Int. Cl.
*H05K 3/36* (2006.01)
(52) U.S. Cl. .......................................... 29/830; 29/846
(58) Field of Classification Search ................... 29/829, 29/830, 846–853
See application file for complete search history.

(56) References Cited

U.S. PATENT DOCUMENTS

| 4,689,442 A | 8/1987 | Ozaki et al. |
| 5,937,515 A | 8/1999 | Jhonson et al. |
| 2003/0104184 A1 | 6/2003 | Hirai et al. |

FOREIGN PATENT DOCUMENTS

| DE | 29 29 050 A1 | 2/1980 |
| FR | 2 612 356 A | 9/1988 |
| GB | 994 031 A | 6/1965 |
| JP | 2001-223471 A | 8/2001 |

OTHER PUBLICATIONS

European Search Report for EP 05 29 2274 mailed Feb. 24, 2006.

*Primary Examiner*—Jeremy C Norris
(74) *Attorney, Agent, or Firm*—Darby & Darby P.C.

(57) ABSTRACT

A wiring board is manufactured by a step of forming a meshy cylindrical body, where plural conductive rings are connected to each other at plural positions in the respective peripheral direction, a step of forming laminated meshy sheets, by squashing the meshy cylindrical body in the radial direction, a step of inserting an insulation sheet between the meshy sheets, and a step of forming lacking portions at a position in the peripheral direction of conductive rings of the meshy sheets. It becomes possible to directly join a semiconductor chip to the conductive ring of the meshy sheet, and therefore, a wiring circuit can be obtained without using a solder joint.

2 Claims, 5 Drawing Sheets

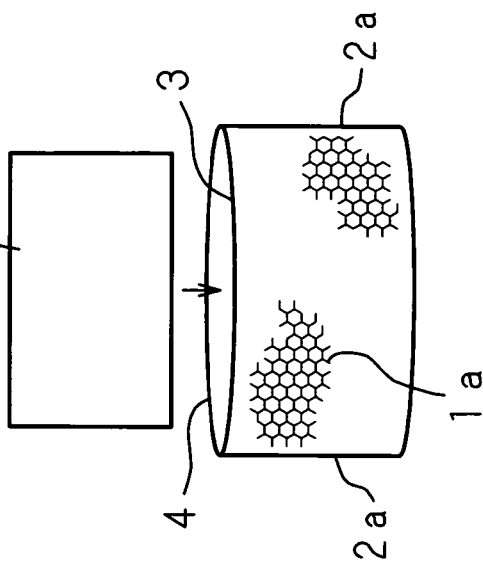
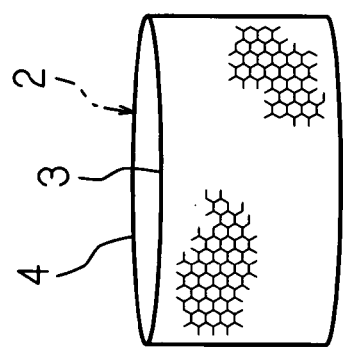
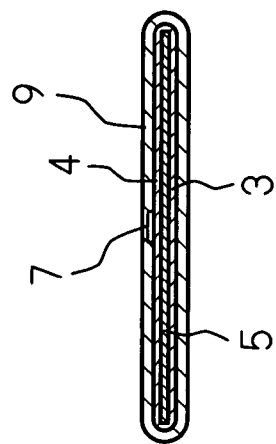
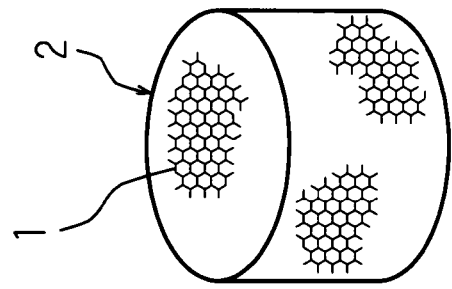
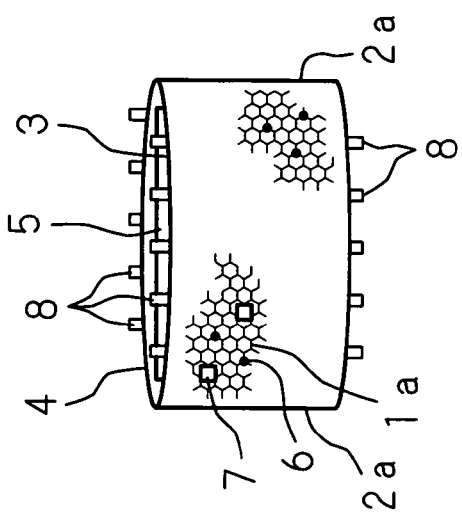
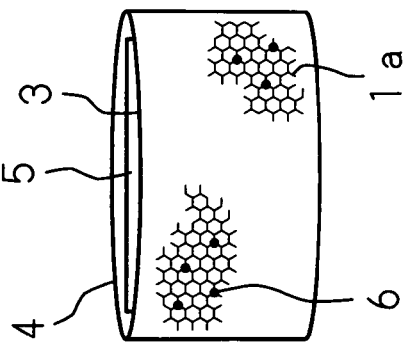

WIRING BOARD AND MANUFACTURING METHOD THEREFOR

CROSS REFERENCE TO RELATED APPLICATIONS

This Nonprovisional application claims priority under 35 U.S.C.§119 (a) on Patent Application Ser. No. 2004-319041 filed in Japan on Nov. 2, 2004, the entire contents of which are hereby incorporated by reference.

BACKGROUND OF THE INVENTION

1. Field of the Invention

The present invention relates to a wiring board capable of forming a wiring circuit to which electronic parts are joined without using solder joint.

2. Description of Related Art

Wiring boards are formed as laminated boards where an insulating board and a conductive layer made of copper foil or the like are laminated and a wiring pattern is formed in the conductive layer by etching or the like. In addition, electronic parts such as ICs (Integrated Circuits) and LSIs (Large Scale Integrated circuits) are joined, by means of soldering, and mounted onto the conductive layer where the wiring pattern has been formed, and thereby, a wiring circuit is formed. Here, such electronic parts have a configuration such that a semiconductor chip made by cutting a wafer into pieces is joined to and mounted on the surface of an insulating board, a surface on which wiring has been formed, of a circuit board where a metal conductive board and the insulating board are laminated.

In addition, Japanese Patent Application Laid-Open No. 2001-223471, for example, discloses a method for manufacturing a wiring board in the following. First, a first printed circuit board where plural first conductive wires are placed parallel to each other on one surface of a first resin sheet and a second printed circuit board where plural second conductive wires are placed parallel to each other on one surface of a second resin sheet are laminated in such a manner that the first conductive wires and the second conductive wires cross at right angles. Then, electrical connections are made by irradiating the intersections of the first conductive wires and the second conductive wires with a laser beam under a state where an insulating layer is inserted between the first conductive wires and the second conductive wires. As a result of the above, a wiring circuit is formed on a wiring board.

Wiring boards inevitably resonate when they are utilized in an environment in which relatively large vibration occurs such as in the case where a wiring board is placed in the proximity to an electric motor, an internal combustion engine or the like or in the case where it is mounted in a vehicle. Therefore, when a conventional wiring board, wiring circuit of which has been formed by joining electronic parts to the wiring board by soldering is utilized in such an environment, the solder joints of the electronic parts become fragile due to resonance as described above, and therefore, a problem arises such that a solder joint is easily broken. In addition, electronic parts are joined to a conventional wiring board by soldering so that a wiring circuit is formed, and therefore, miniaturization is restricted and an improvement measure in related to this has been demanded. Furthermore, a relatively strong joining force has been obtained by utilizing a solder including lead in a conventional solder joint. However, lead is not an environmentally friendly substance, and therefore, utilization of a solder not including lead has been required from the point of view of reduction of a substance that is not environmentally friendly. In the case where such a so-called Pb free solder is utilized for conventional wiring board, currently solder joints tend to become fragile.

In addition, according to the invention disclosed in the above described Japanese Patent Application Laid-Open No. 2001-223471, the first and second printed circuit boards where plural conductive wires are placed parallel to each other on each of the two resin sheets are required, and therefore, the structure inevitably become complicated. In addition, electrical connections at the intersections of the first conductive wires and the second conductive wires are made by welding using a laser beam or the like, and therefore, a problem arises such that a joint between a first conductive wire and a second conductive wire is easily broken in response to resonance in the case where the wiring board is mounted in a vehicle or the like. Furthermore, a problem arises such that a defect easily occurs in a contact due to a thermal impact, wearing caused by plasma and the like in addition to a problem in response to resonance as described above.

BRIEF SUMMARY OF THE INVENTION

The present invention has been achieved in view of the above described situation and a main object thereof is to provide a wiring board where a wiring circuit can be obtained without using a solder joint.

In addition, another object of the present invention is to provide a manufacturing method for a wiring board where a wiring circuit can be obtained without using a solder joint.

A wiring board according to the first aspect of the present invention is characterized by comprising plural conductive rings, wherein each of the conductive rings is integrally connected to other conductive rings at plural positions in the respective peripheral direction so as to be formed into a meshy form, and one or more conductive rings have a lacking portion at one or more positions in the respective peripheral direction.

In addition, a wiring board according to the second aspect of the present invention is characterized by comprising: two meshy sheets laminated by a meshy sheet formed by plural conductive rings each of which is integrally connected to other conductive rings at plural positions in the respective peripheral direction; and an insulation sheet inserted between the two meshy sheets; wherein the two meshy sheets are integrally connected to each other at the respective two end portions, and one or more conductive rings have a lacking portion at one or more positions in the respective peripheral direction.

Furthermore, a wiring board according to the third aspect of the present invention is the wiring board according to the second aspect and is characterized in that each of conductive rings of one of the two meshy sheets is shifted with respect to each of conductive rings of the other meshy sheet in two directions which are perpendicular to each other.

In addition, a wiring board according to the fourth aspect of the present invention is the wiring board according to any of the first to third aspects and is characterized in that a semiconductor chip is directly joined to the conductive rings.

Furthermore, a wiring board according to the fifth aspect of the present invention is the wiring board according to any of the first to third aspects and is characterized in that an optional wiring circuit is formed by appropriately setting the lacking portion at one or more of the conductive rings.

Moreover, a wiring board according to the sixth aspect of the present invention is the wiring board according to the fifth aspect, and is characterized in that a semiconductor chip is directly joined to the optional wiring circuit.

A manufacturing method for a wiring board according to the seventh aspect of the present invention is characterized by comprising the steps of forming a base material to be formed into a meshy form by connecting plural conductive rings each of which is integrally connected to other conductive rings at plural positions in the respective peripheral direction; forming the base material into a cylindrical body; forming laminated meshy sheets by squashing the cylindrical body in a radial direction; inserting an insulation sheet between the laminated meshy sheets; and forming lacking portion at one or more positions in the peripheral direction of one or more conductive rings of the laminated meshy sheets.

The manufacturing method for a wiring board according to the eighth aspect of the present invention is the manufacturing method for a wiring board according to the seventh aspect and is characterized in that, in the step of forming the lacking portions, the plural lacking portions are appropriately formed so as to form an optional wiring circuit by one or more of the conductive rings.

In accordance with a wiring board according to the first aspect of the present invention, a wiring circuit having meshy form where plural conductive rings are integrally connected to each other can be obtained easily, and therefore, it becomes possible to directly join a semiconductor chip that forms electronic parts to a conductive ring and in addition it becomes possible to exclude a solder joint of electronic parts. Accordingly, even in the case where a wiring board is mounted in a vehicle where a relatively great vibration occurs at the time of running, the possibility of breaking a joint portion can be reduced and the wiring board can be made extremely compact.

In addition, in accordance with a wiring board according to the second aspect of the present invention, a double laminated sheet in meshy form can be obtained from a meshy cylindrical body which is squashed in the radial direction. As a result of this, a complicated wiring circuit in meshy form where plural conductive rings are integrally connected to each other can be obtained, and therefore, it becomes possible to directly join a semiconductor chip that forms electronic parts to the conductive ring and in addition it becomes possible to exclude a solder joint of the electronic parts. Accordingly, even in the case where a wiring board is mounted in a vehicle where a relatively great vibration occurs at the time of running, the possibility of breaking a joint portion can be reduced and the wiring board can be made compact relative to the complexity of the obtained wiring circuit.

Furthermore, in accordance with a wiring board according to the third aspect of the present invention, each of conductive rings of one meshy sheet is shifted with respect to each of conductive rings of the other meshy sheet in the two directions which are perpendicular to each other, and therefore, the majority of connecting portions of the conductive rings of the two, upper and lower, meshy sheets do not directly superimpose each other. Accordingly, lacking portions can be provided in appropriate portions within these sheets, and thereby, a more complicated wiring circuit can be formed in optional form and can be made compact for the complexity of the obtained wiring circuit.

Moreover, in accordance with a wiring board according to the fourth aspect of the present invention, a semiconductor chip that forms electronic parts is directly joined to the conductive ring. Accordingly, a solder joint of the electronic parts on which a semiconductor chip has been mounted can be excluded, and in addition, the structure can be simplified and the wiring board can be made compact.

In addition, in accordance with a wiring board according to the fifth aspect of the present invention, it is possible to appropriately provide lacking portions in connecting portions of the conductive rings, and therefore, an optional wiring circuit can be formed.

Furthermore, in accordance with a wiring board according to the sixth aspect of the present invention, it becomes possible to directly join a semiconductor chip that forms electronic parts to the conductive ring of the wiring circuit having been formed in optional form. Accordingly, a solder joint of the electronic parts on which a semiconductor chip has been mounted can be excluded, and in addition, the structure can be simplified and the wiring board can be made compact.

Moreover, in accordance with a manufacturing method for a wiring board according to the seventh aspect of the present invention, two meshy sheets can be obtained from a meshy cylindrical body, and in addition, lacking portions are provided in conductive rings of the meshy sheets, and thereby, an optional wiring circuit can be formed, and thus, the manufacturing cost can be reduced and a compact wiring board can be manufactured.

In addition, in accordance with a manufacturing method for a wiring board according to the eighth aspect of the present invention, plural lacking portions can be arbitrarily formed, and thereby, it becomes possible to form an optional wiring circuit.

The above and further objects and features of the invention will more fully be apparent from the following detailed description with accompanying drawings.

BRIEF DESCRIPTION OF THE SEVERAL VIEWS OF THE DRAWINGS

FIG. 1A through FIG. 1F are schematic diagrams illustrating a manufacturing method of a wiring board according to the present invention;

DETAILED DESCRIPTION OF THE PRESENT INVENTION

In the following, the present invention will be described in detail in reference to the drawings showing the embodiments thereof.

Figure 2:
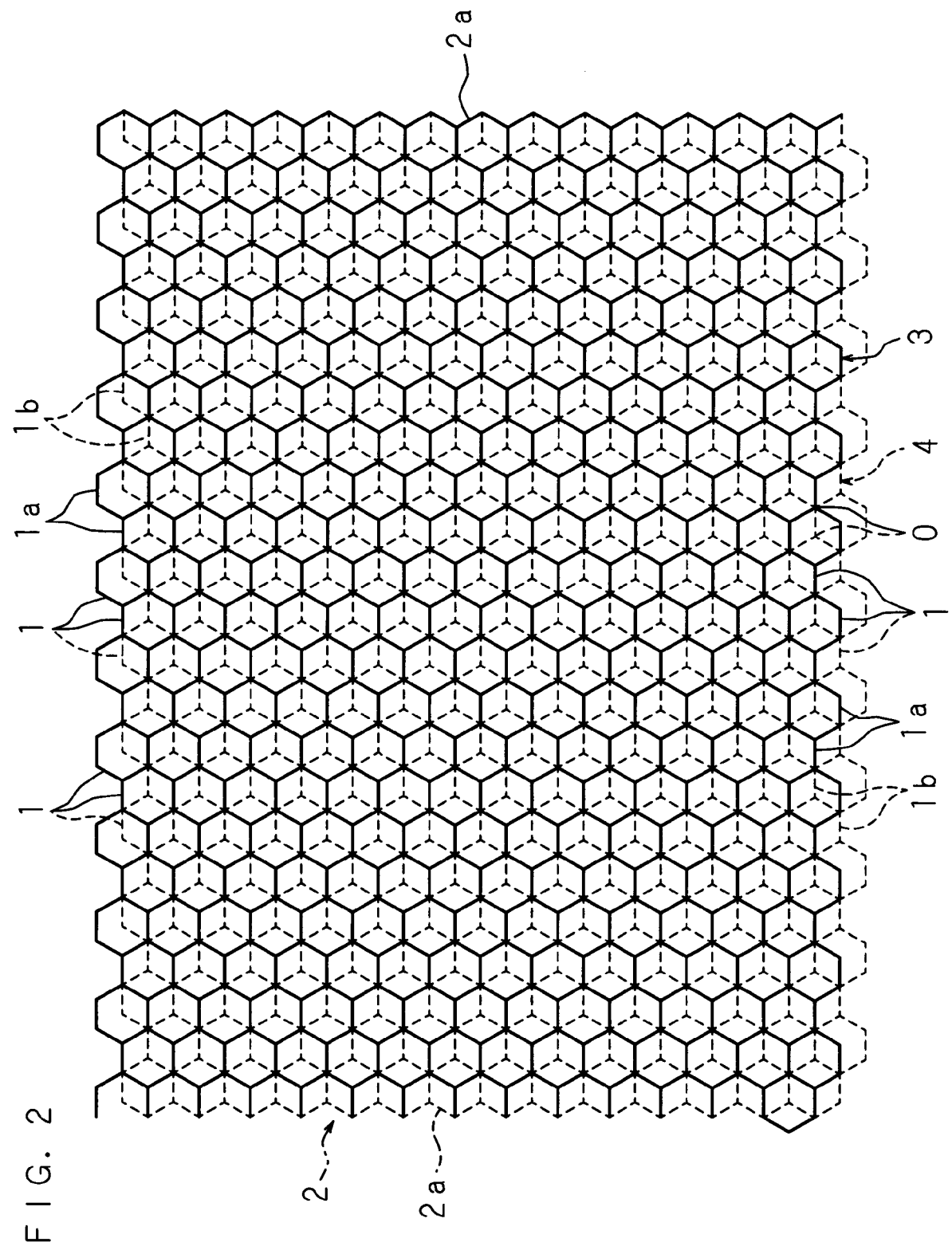
FIG. 2 is an enlarged plan view showing a state of a meshy cylindrical body having been squashed in the radial direction and flattened in order to manufacture a wiring board according to the present invention.
Figure 3:
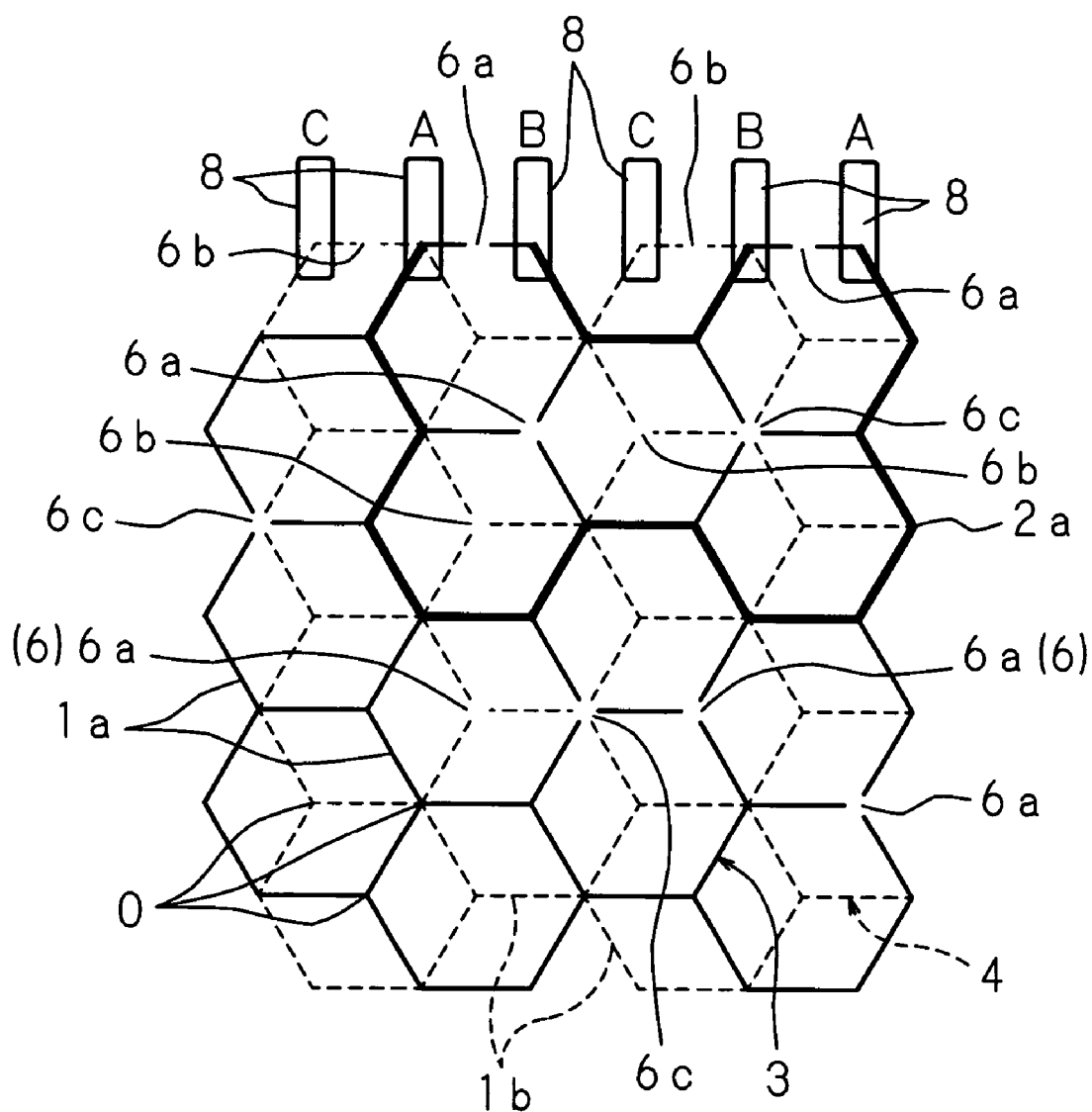
FIG. 3 is a partially enlarged view showing a state of a wiring board according to the present invention when an appropriate wiring circuit has been formed.
Figure 4:
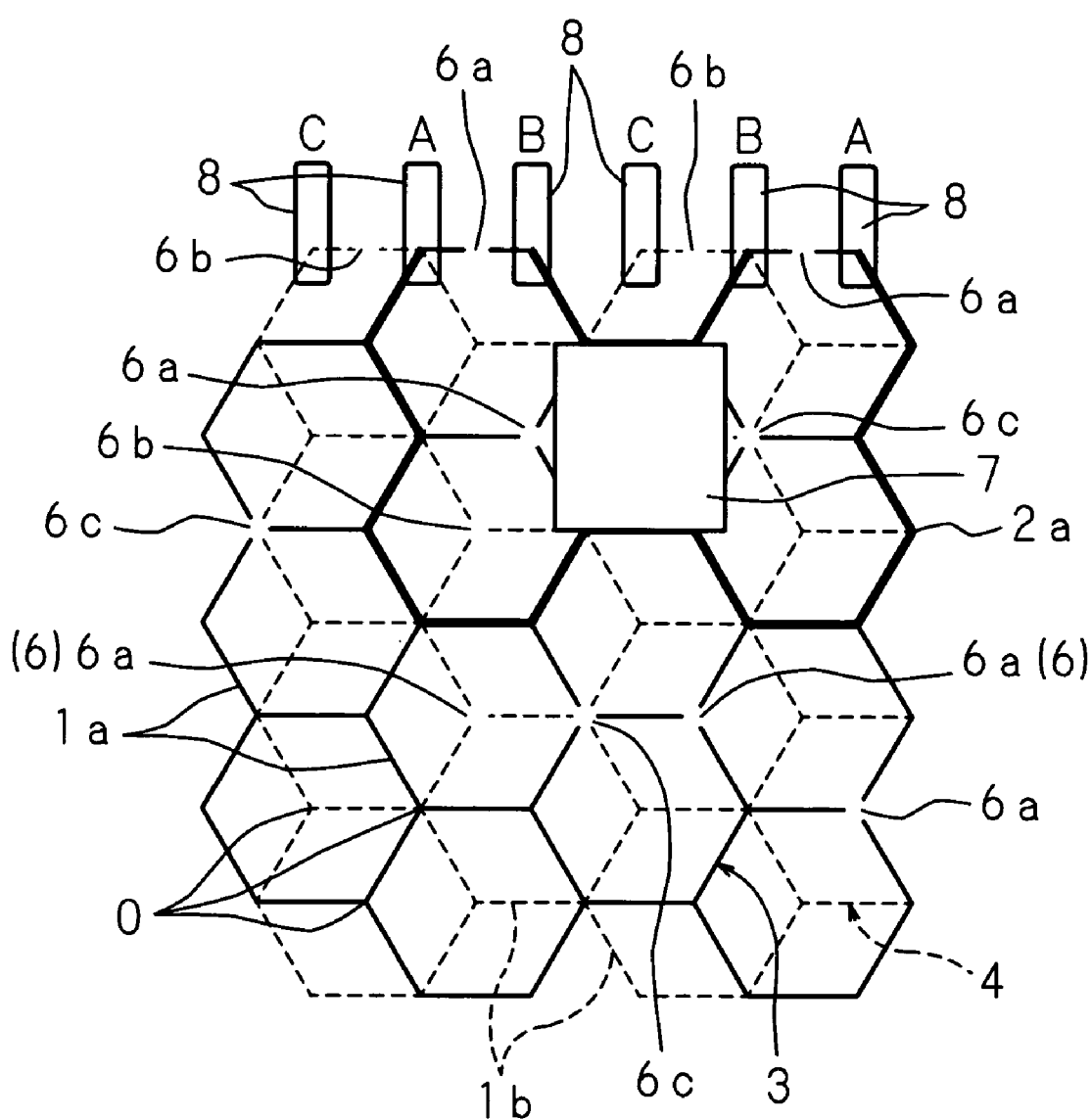
FIG. 4 is a partially enlarged view showing a state of a wiring board according to the present invention when a semiconductor chip has been mounted.
Figure 5:
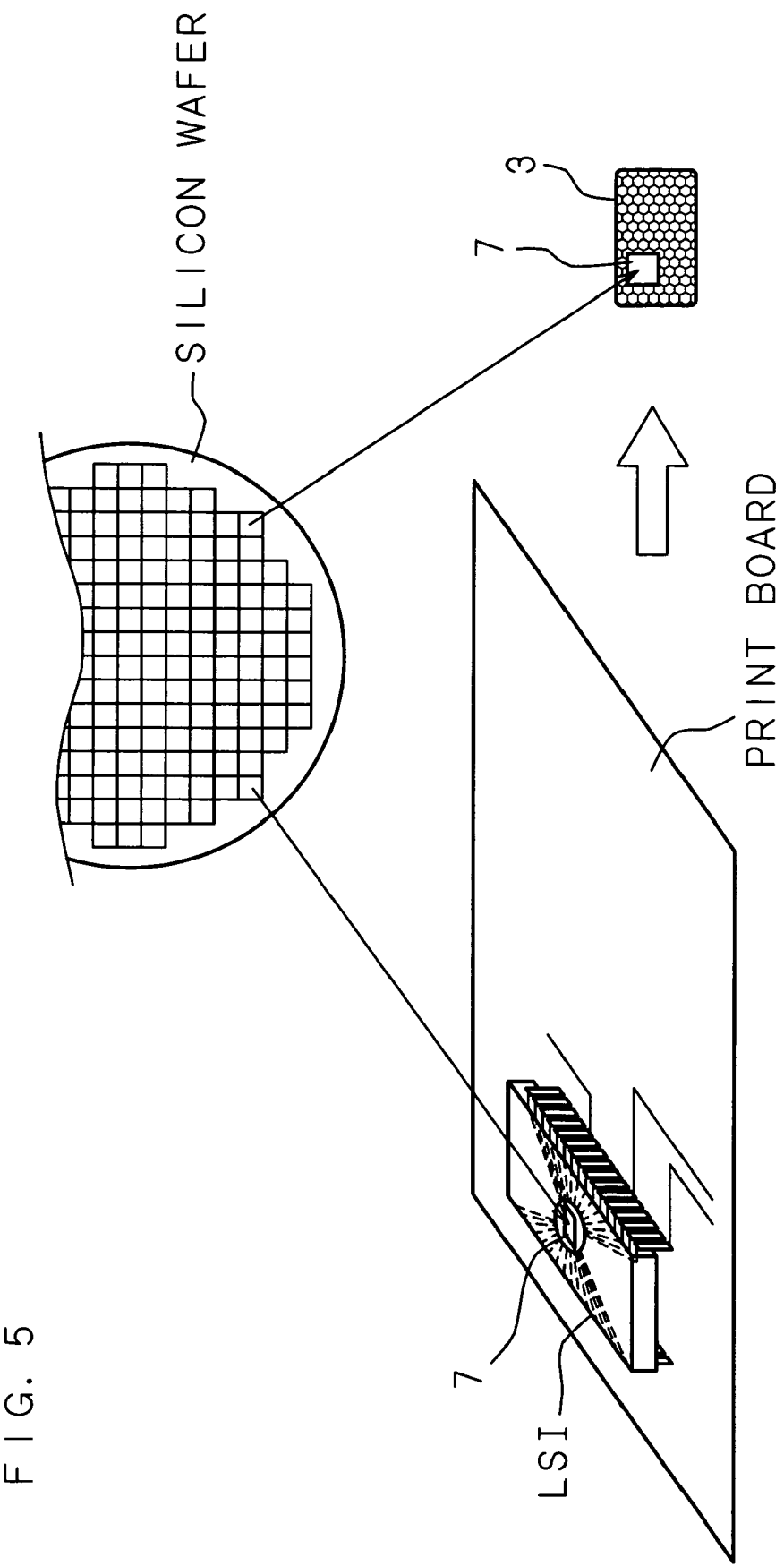
FIG. 5 is a schematic diagram illustrating an example for mounting a semiconductor chip and for mounting electronic parts on a wiring board according to the present invention.

FIG. 1A through FIG. 1F are schematic diagrams illustrating a manufacturing method of a wiring board according to the present invention; FIG. 2 is an enlarged plan view showing a state of a meshy cylindrical body having been squashed in the radial direction and flattened in order to manufacture a wiring board according to the present invention; FIG. 3 is a partially enlarged view showing a state of a wiring board according to the present invention when an appropriate wiring circuit has been formed; FIG. 4 is a partially enlarged view showing a state of a wiring board according to the present invention when a semiconductor chip has been mounted; and FIG. 5 is a schematic diagram illustrating an example for mounting a semiconductor chip and for mounting electronic parts on a wiring board according to the present invention.

The wiring board according to the present invention is manufactured in accordance with a manufacturing method according to the present invention as follows:

(1) first, as shown in FIG. 1A, a base material is manufactured into a meshy form where plural gold conductive rings 1, each of which is in approximately hexagonal form, are integrally connected to each other at plural positions in the peripheral direction of each conductive ring 1 as a honeycomb form as a whole. Then, this base material of a meshy form is formed into a cylindrical form, and thereby, a meshy cylindrical body 2 is manufactured. Here, the respective sides of the conductive rings 1, each of which is in approximately hexagonal form, form portions of the adjoining conductive rings 1. Accordingly, a base material is formed of plural conductive rings 1 so as to have a meshy form as a whole.

(2) Next, as shown in FIG. 1B, the meshy cylindrical body 2 is squashed in the radial direction and flattened, and thereby, is made into a state where two layers are laminated. In the following, the respective layers are referred to as a first meshy sheet 3 (located on the front side in FIG. 1B through FIG. 1E) and a second meshy sheet 4 (located on the rear side in FIG. 1B through FIG. 1E). Hereinafter, the respective conductive rings forming the first meshy sheet 3 are denoted by reference numeral "1a" and the respective conductive rings forming the second meshy sheet 4 are denoted by reference numeral "1b."

Here, when the meshy cylindrical body 2 is squashed in the radial direction and flattened so that the first and second meshy sheets 3 and 4 are formed, the respective conductive rings 1a of the first meshy sheet 3 and the respective conductive rings 1b of the second meshy sheet 4 have positional relationships where they are shifted from each other in the two directions perpendicular to each other in plane of the two meshy sheets 3 and 4 by approximately ½ the size of each conductive ring, respectively. As a result, in the laminated first and second meshy sheets 3 and 4, each connecting portion O of conductive rings 1b (indicated by broken lines in FIG. 2) of the second meshy sheet 4 is positioned at approximately the center of each conductive ring 1a (indicated by solid line in FIG. 2) of the first meshy sheet 3. In other words, the first and second meshy sheets 3 and 4 are laminated in a state where the respective conductive rings 1a and the respective rings 1b do not superimpose each other.

(3) Next, as shown in FIG. 1C, a film made of a synthetic resin is inserted as an insulation sheet 5 into the inside of the first and second meshy sheets 3 and 4, that is to say, between the first meshy sheet 3 and the second meshy sheet 4 which are laminated on each other.

At this time, the first and second meshy sheets 3 and 4 are connected at two peripheral positions (hereinafter respectively referred to as bent portions 2a, 2a) which have become bending lines when the meshy cylindrical body 2 is squashed. In other words, the first and second meshy sheets 3 and 4 are integrally connected at the respective two end portions. Accordingly, the first and second meshy sheets 3 and 4 can be obtained in a state where they are laminated, nevertheless it is not necessary to combine the two in a specific manner.

(4) Next, as shown in FIG. 1D and FIG. 3, plural connecting portions O of conductive rings 1a and 1b of the respective first and second meshy sheets 3 and 4 are selectively cut using an appropriate cutting means or a laser. As a result, lacking portions 6 are selectively formed in appropriate portions among plural connecting portions O, and thereby, electrical connections are cut at the respective lacking portions 6 so that an optional wiring circuit is formed.

Here in FIG. 3, a lacking portion 6a indicates a state where a connecting portion O is lacking in the first meshy sheet 3, a lacking portion 6b indicates a state where a connecting portion O is lacking in the second meshy sheet 4 and a lacking portion 6c indicates a state where a connecting portion O of the first and second meshy sheets 3 and 4 is lacking, respectively.

Then, plural electrodes 8 are directly joined by using gold for joining to disconnecting portions, where the first and second meshy sheets 3 and 4 are not integrally connected, along the peripheral positions of the sheets. At this time, as indicated by thick solid lines in FIG. 3, for example, plural lacking portions 6a, 6b and 6c can be selectively formed so that two A electrodes 8 and 8 are electrically connected to each other, two B electrodes 8 and 8 are electrically connected to each other, and the wiring circuit between the two A electrodes 8 and 8 and the wiring circuit between the two B electrodes 8 and 8 are not electrically connected to each other.

(5) Next, as shown in FIG. 1E and FIG. 4, a semiconductor chip 7 is directly joined to a conductive ring 1a of the first meshy sheet 3 by using gold for joining, and thereby, the semiconductor chip 7 is mounted. At this time, the semiconductor chip 7 is joined to the wiring circuit between the two A electrodes 8 and 8 and to the wiring circuit between the two B electrodes 8 and 8, and thereby, the semiconductor chip 7 is electrically connected between the A electrodes and the B electrodes. Here, as described above, the first and second meshy sheets 3 and 4 are integrally connected at the two bent portions 2a, 2a which were bent when the meshy cylindrical body 2 was squashed.

(6) Finally, as shown in FIG. 1F, the meshy sheets 3 and 4 to which the semiconductor chip 7 and electrodes 8 are joined, and in addition, the insulation sheet 5 has been inserted, are enclosed by a synthesis resin film such as an epoxy resin, and thereby, an envelope layer 9 is formed. As a result of the above, the manufacture of a wiring board according to the present invention is completed.

The wiring board according to the present invention having been manufactured in accordance with a manufacturing method according to the present invention as described above is provided with: two meshy sheets 3 and 4 which are laminated by being squashed in the radial direction of a base material, where plural conductive rings 1 in approximately hexagonal form are connected to each other at plural peripheral positions thereof so as to form a meshy form, after the base material has been formed into a cylindrical form; an insulation sheet 5 inserted between these meshy sheets 3 and 4; a semiconductor chip 7 joined to a conductive ring 1a of the first meshy sheet 3; electrodes 8; and an enveloped layer 9. In addition, the first and second meshy sheets 3 and 4 are integrally connected after the base material has been squashed in the radial direction at two positions (bent portions 2a, 2a) in the peripheral direction when the base material is formed in the cylindrical form. Furthermore, lacking portions 6 are formed in appropriate portions among plural connecting portions O of the respective conductive rings 1a of the first meshy sheet 3 and plural connecting portions O of the respective conductive rings 1b of the second meshy sheet 4.

Furthermore, it is possible to utilize individually plural wiring boards, each of which is the same as the above described wiring board according to the present invention, and in addition to this, it is possible to accumulate and utilize them together. Moreover, it is also possible to mount an LSI, whose terminals for joining have not yet been attached, onto the first meshy sheet 3 by joining to conductive rings 1*a* in an alternative configuration where the semiconductor chip 7 is mounted.

As described above, in the wiring board according to the present invention, it becomes possible to form a wiring circuit of the meshy sheets 3 and 4 by squashing the meshy cylindrical body 2 in the radial direction. Accordingly, the length of one side of each conductive ring 1*a*, 1*b* can be made, for example, at approximately 0.1 mm, and therefore, it becomes possible to make the wiring board very compact.

Here, in the above described embodiment, the meshy cylindrical body 2 is squashed in the radial direction, and thereby, a state where the two meshy sheets 3 and 4 are laminated is obtained. In addition to this, however, one meshy sheet body, where plural conductive rings are connected to each other at plural peripheral positions thereof, may be folded so that two or more meshy sheets which are laminated on each other can be formed. Furthermore, it is possible to form a wiring board of only one meshy sheet.

In addition to honeycomb form of the meshy sheets 3 and 4, where the respective conductive rings 1*a*, 1*b* are in approximately hexagonal form, it is possible to form meshes of polygons, such as approximately triangular form and approximately quadrilateral form as well as approximately honeycomb form where each conductive ring is in approximately circular form. That is, the configuration of each conductive ring 1*a*, 1*b* is not restrictive.

In addition, in the above described embodiment, a semiconductor chip 7 and an envelope layer 9 are provided in the configuration. In addition to this, however, a semiconductor chip 7 may be provided in the configuration without an envelope layer 9. Furthermore, the first and second meshy sheets 3 and 4, between which the insulation sheet 5 has been inserted, may be provided in the configuration without a semiconductor chip 7 or an envelope layer 9, and alternatively, only one meshy sheet may be provided in the configuration.

Furthermore, though the respective conductive rings 1 (1*a*, 1*b*) are made of gold in the above described embodiment, other conductive metal materials, for example, copper may of course be used.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalents of such metes and bounds there-of are therefore intended to be embraced by the claims.

The invention claimed is:

1. A manufacturing method for a wiring board, comprising steps of:
    forming a base material in a meshy form by connecting plural conductive rings each of which is integrally connected to other conductive rings at plural positions in the respective peripheral direction;
    forming said base material into a cylindrical body;
    forming laminated meshy sheets by squashing said cylindrical body in a radial direction;
    inserting an insulation sheet between the said laminated meshy sheets; and
    forming lacking portion at one or more positions in the peripheral direction of one or more said conductive rings of said laminated meshy sheets.

2. The manufacturing method for a wiring board as set forth in claim 1, wherein, in said step of forming said lacking portions, one or more of said plural lacking portions are appropriately formed at one or more of said conductive rings so as to form an optional wiring circuit.

* * * * *